(12) United States Patent
Ma

(10) Patent No.: US 10,014,351 B2
(45) Date of Patent: Jul. 3, 2018

(54) ORGANIC LIGHT-EMITTING DIODE TOUCH DISPLAY PANEL, METHOD FOR FABRICATING THE SAME, AND DISPLAY APPARATUS CONTAINING THE SAME

(71) Applicant: BOE TECHNOLOGY GROUP CO., LTD, Beijing (CN)

(72) Inventor: Zhan Jie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/122,881

(22) PCT Filed: Feb. 22, 2016

(86) PCT No.: PCT/CN2016/074262
§ 371 (c)(1),
(2) Date: Aug. 31, 2016

(87) PCT Pub. No.: WO2017/016218
PCT Pub. Date: Feb. 2, 2017

(65) Prior Publication Data
US 2017/0179203 A1  Jun. 22, 2017

(30) Foreign Application Priority Data

Jul. 30, 2015  (CN) .......................... 2015 1 0461453

(51) Int. Cl.
*H01L 27/32* (2006.01)
*G06F 3/041* (2006.01)
(Continued)

(52) U.S. Cl.
CPC .......... *H01L 27/323* (2013.01); *G06F 3/0412* (2013.01); *G09G 3/3225* (2013.01);
(Continued)

(58) Field of Classification Search
CPC ............... H01L 27/323; H01L 27/3276; H01L 51/5221; H01L 2227/323; G06F 3/0412;
(Continued)

(56) References Cited

U.S. PATENT DOCUMENTS 7,145,289 B2 * 12/2006 Yamazaki ............ G01N 33/497
313/506
8,497,627 B2 * 7/2013 Lee ........................ H01L 51/524
313/483

(Continued)

FOREIGN PATENT DOCUMENTS

CN    103715205 A    4/2014
CN    104217677 A    12/2014
(Continued)

OTHER PUBLICATIONS

The World Intellectual Property Organization (WIPO) International Search Report and Written Opinion for PCT/CN2016/074262 dated May 25, 2016 12 Pages.

*Primary Examiner* — Stephen G Sherman
(74) *Attorney, Agent, or Firm* — Anova Law Group, PLLC

(57) ABSTRACT

The present disclosure provides an organic light-emitting diode (OLED) touch display panel. The OLED touch display panel includes a packaging substrate, having a touch sensing region and a touch pin line region on a first surface of the packaging substrate, the touch sensing region including a plurality of touch electrodes, the touch pin line region including a plurality of touch lines forming one-to-one electrical connections with the touch electrodes; and an array substrate, having a display region, a connecting region, and a packaging region on a first surface of the array substrate, the display region having an OLED structure, the connecting region having a plurality of conductive lines connectable to a touch control chip. The first surface of the (Continued)

packaging substrate and the first surface of the array substrate are facing each other, the conductive lines forming one-to-one connection with the touch lines through a plurality of via holes.

18 Claims, 4 Drawing Sheets

(51) Int. Cl.
*G09G 3/3225* (2016.01)
*H01L 51/52* (2006.01)

(52) U.S. Cl.
CPC ...... *H01L 27/3276* (2013.01); *H01L 51/5221* (2013.01); *G06F 2203/04103* (2013.01); *G06F 2203/04111* (2013.01); *H01L 2227/323* (2013.01)

(58) Field of Classification Search
CPC . G06F 2203/04103; G06F 2203/04111; G09G 3/3225
See application file for complete search history.

(56) References Cited

U.S. PATENT DOCUMENTS

| | | | |
|---|---|---|---|
| 8,502,225 B2* | 8/2013 | Yamazaki | H01L 27/1225 257/59 |
| 2010/0072482 A1* | 3/2010 | Eom | H01L 27/3276 257/72 |
| 2015/0060809 A1 | 3/2015 | Kim et al. | |
| 2016/0274719 A1 | 9/2016 | Yang et al. | |
| 2017/0069705 A1 | 3/2017 | Cao | |

FOREIGN PATENT DOCUMENTS

| | | |
|---|---|---|
| CN | 104425560 A | 3/2015 |
| CN | 104465711 A | 3/2015 |
| CN | 105138163 A | 12/2015 |
| WO | 2017016218 A1 | 2/2017 |

* cited by examiner

ORGANIC LIGHT-EMITTING DIODE TOUCH DISPLAY PANEL, METHOD FOR FABRICATING THE SAME, AND DISPLAY APPARATUS CONTAINING THE SAME

CROSS-REFERENCES TO RELATED APPLICATIONS

This PCT patent application is a national phase entry under 35 U.S.C. § 371 of International Application No. PCT/CN2016/074262, filed on Feb. 22, 2016, which claims priority of Chinese Patent Application No. 201510461453.9, filed on Jul. 30, 2015. The above enumerated patent applications are incorporated by reference herein in their entirety.

FIELD OF THE INVENTION

The present invention generally relates to the display technologies and, more particularly, relates to an organic light-emitting diode (OLED) touch display panel, a method for fabricating the same, and a display apparatus containing the OLED display panel.

BACKGROUND

As touch screen technologies advance and market demand increases, overall-thinned display module has become a main market trend. Thus, touch structures have evolved from structures with on-cell touch sensors to structures with embedded touch sensors. The display panels with embedded touch sensors may have further reduced thickness. Meanwhile, the fabrication cost for the touch panel may also be greatly reduced.

Currently, the touch structures in existing active matrix organic light-emitting diode (AMOLED) touch display panels are often on-cell touch sensors/structures. The on-cell touch structures are often placed on a top surface of a packaging substrate. A touch control chip is often placed on the packaging substrate to form an integral touch module. When packaging the display panel, the top surface of the packaging substrate holds the touch module, and the bottom surface of the packaging substrate is bonded with an array substrate with an OLED structure. Because of the touch module on the top surface of the packaging substrate, it is often difficult to thin down the packaging substrate. It is thus difficult to reduce the overall thickness of the display panel. As a result, the display panel may often be bulky and heavy, which is not desirable in a market that favors light and thin display panels.

Therefore, it is desirable to reduce the volume and weight of the touch display panels.

BRIEF SUMMARY OF THE DISCLOSURE

The present disclosure provides an OLED touch display panel, a method for fabricating the OLED touch display panel, and a display apparatus containing the OLED touch display panel. The weight and volume of the OLED touch display panel can be reduced.

One aspect of the present disclosure includes an organic light-emitting diode (OLED) touch display panel. The OLED touch display panel includes a packaging substrate, having a touch sensing region and a touch pin line region on a first surface of the packaging substrate, the touch sensing region including a plurality of touch electrodes, the touch pin line region including a plurality of touch lines forming one-to-one electrical connections with the touch electrodes; and an array substrate, having a display region, a connecting region, and a packaging region on a first surface of the array substrate, the display region having an OLED structure, the connecting region having a plurality of conductive lines connectable to a touch control chip. The first surface of the packaging substrate and the first surface of the array substrate are facing each other, the conductive lines forming one-to-one connection with the touch lines through a plurality of via holes.

Optionally, on the array substrate, the connecting region is between the display region and the packaging region; and the touch pin line region of the packaging substrate corresponds to the connecting region of the array substrate.

Optionally, the connecting region further includes a passivation layer on the conductive lines, the passivation layer including the plurality of via holes, the conductive lines forming one-to-one electrical connections with the touch lines through the via holes.

Optionally, each of the via holes corresponds to one of the conductive lines.

Optionally, the via holes are filled with a conductive material for connecting the conductive lines and the touch lines.

Optionally, a cathode layer of the OLED structure is formed with a same conductive material.

Optionally, the via holes and the cathode layer of the OLED structure are formed through a same deposition process.

Optionally, the first surface of the packaging substrate further includes a protection layer for protecting the touch electrodes, the protection layer having a plurality of openings and each opening corresponding to one touch line.

Another aspect of the present disclosure provides a touch display apparatus. The touch display apparatus includes one or more of the disclosed OLED touch display panels.

Another aspect of the present disclosure provides a method for forming an organic light-emitting diode (OLED) touch display panel. The method includes forming an OLED structure in a display region and conductive lines in a connecting region on a first surface of an array substrate, the conductive lines being connectable to a touch control chip; forming a passivation layer on the array substrate to cover the conductive lines; and forming a plurality of via holes in the passivation layer to expose the conductive lines and filling the via holes in the passivation layer with a conductive material. The method also includes forming a patterned layer of a conductive material to fill the plurality of via holes and extend on the passivation layer in regions for connecting touch lines; forming touch electrodes in a touch sensing region and forming touch lines in a touch pin line region on a first surface of a packaging substrate; and packaging the packaging substrate and the array substrate so that the first surface of the packaging substrate faces the first surface of the array substrate, wherein the conductive lines forming one-to-one connections with the touch lines through the plurality of via holes.

Optionally, the method further includes performing one patterning process to form an anode layer of the OLED structure and the conductive lines.

Optionally, the method further includes forming gates, semiconductor layers, drains, and sources of thin-film transistors (TFTs), and pixel electrodes in the display region.

Optionally, forming the patterned layer of the conductive material includes depositing a layer of the conductive material to fill the via holes in the passivation layer and be deposited on the passivation layer, and patterning the layer of the conductive material so that the conductive material fills the via holes and extends on the passivation layer in regions for connecting touch lines.

Optionally, the method further includes performing one patterning process to form gates and the conductive lines.

Optionally, the method further includes performing one patterning process to form the sources, the drains, and the conductive lines.

Optionally, the method further includes performing a deposition process to form a cathode layer of the OLED structure and fill the via holes in the passivation layer.

Optionally, the method further includes forming a protection layer on the first surface of the packaging substrate to cover the touch electrodes and the touch lines; and forming opening regions in the protection layer to expose the touch lines.

Optionally, the method further includes thinning a second surface of the packaging substrate that faces away from the OLED structure; and thinning a second surface of the array substrate that faces away from the OLED structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

Figure 1:
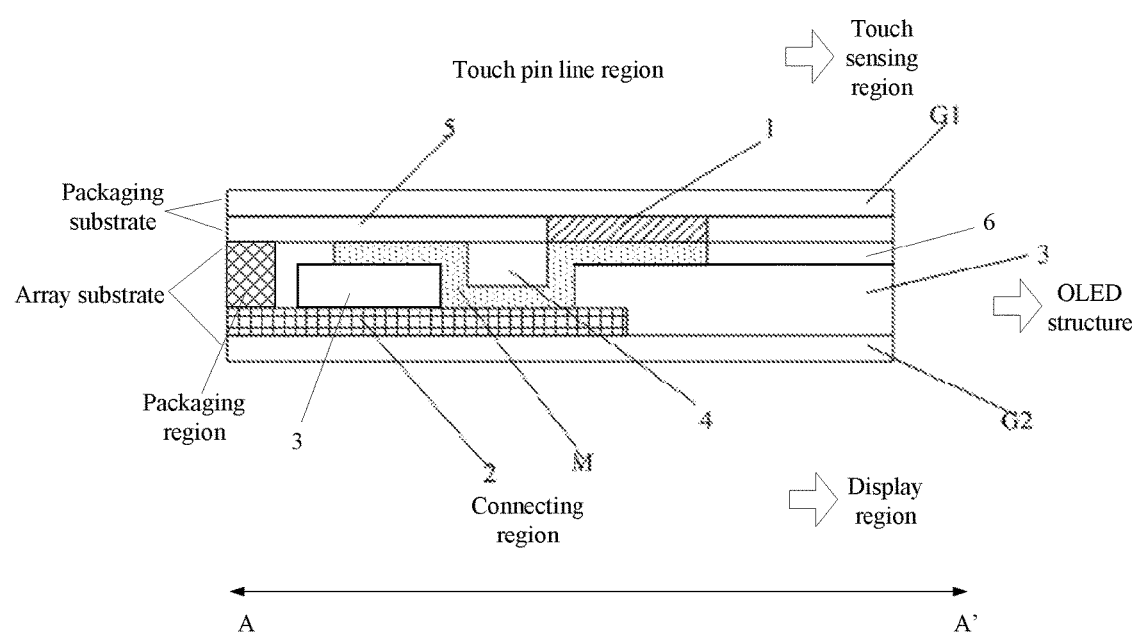
FIG. 1 illustrates a cross-sectional view of an exemplary connecting region of the OLED touch display panel according to the embodiments of the present disclosure.

One aspect of the present disclosure provides an OLED touch display panel. As shown in FIG. 1, the OLED touch display panel may include a packaging substrate G1 and an array substrate G2.

Figure 2:
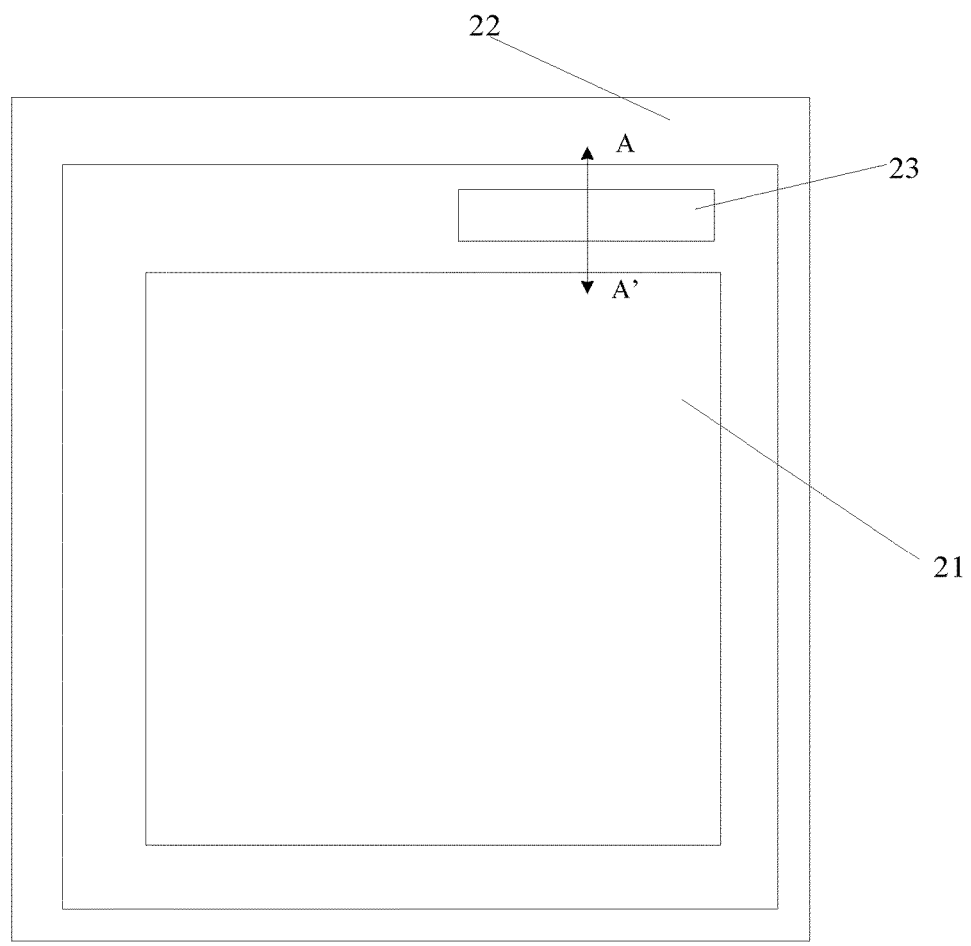
FIG. 2 illustrates a top view of the array substrate in the OLED touch display panel according to the embodiments of the present disclosure.

FIGS. 1 and 2 show an exemplary OLED touch display panel. FIG. 1 illustrates the cross-sectional view of a portion of an exemplary connecting region of the OLED touch display panel along the AA' direction as shown in FIG. 2. The first surface of the packaging substrate G1 may include a touch sensing region and a touch pin line region. In one embodiment, the first surface of the packaging substrate G1 may be the bottom surface of the packaging substrate G1. The bottom surface of the packaging substrate G1 may refer to the surface downwardly facing the array substrate G2. The touch sensing region may include a plurality of touch electrodes (not shown). The touch pin line region may include a plurality of touch lines 1, as shown in FIG. 1. Each touch line 1 may be connected to a different touch electrode, and each touch electrode may be connected to a different touch line 1. The touch lines 1 may correspond to and be connected to the touch electrodes according to a one-to-one relationship or one-to-one connection. For illustrative purposes, only one touch line 1 is shown in FIG. 1. The packaging substrate G1 may be made of any suitable materials such as glass and/or plastic. In FIG. 1, element 6 may represent space between the passivation layer 3 and the protection layer 5. The space 6 may or may not be filled with an insulating material.

The array substrate G2 may include a display region, a connecting region, and a packaging region (shown as 21, 23, and 22 in FIG. 2, respectively) on the first surface of the array substrate G2, as shown in FIG. 1. In one embodiment, the first surface of the array substrate G2 may be the top surface of the array substrate G2. The top surface of the array substrate G2 may refer to the surface upwardly facing the packaging substrate G1. The display region 21 may include an OLED structure. The OLED structure may include a plurality of OLEDs and related components for emitting light in operation. In some embodiments, the packaging region 22 may include a touch control chip (not shown). In certain other embodiments, the touch control chip may be arranged in other suitable locations, such as the back of the array substrate G2, depending on different applications and/or designs. As shown in FIG. 1, the connecting region 23 may include a plurality of conductive lines 2 connected or connectable to the touch control chip. For illustrative purposes, only one conductive line 2 is shown in FIG. 1. The connecting region 23 may also include a passivation layer 3 on the conductive line 2. A via hole 4 may be formed on a corresponding conductive line 2 in the passivation layer 3. It should be noted that, the terms "bottom surface" and "top surface" are only relative and for illustrative purposes. In certain embodiments, the relative positions of the packaging substrate G1 and the array substrate G2 may switch. In this case, the "bottom surface" and the "top surface" should be subjected to different embodiments and should not be limited by the embodiments of the present disclosure.

The touch pin line region of the packaging substrate G1 may correspond to the connecting region 23 of the array substrate G2. A touch line 1 may correspond to a conductive line 2 through the via hole 4 according to a one-to-one relationship.

The disclosed OLED touch display panel may include a packaging substrate G1 and an array substrate G2. The first surface of the packaging substrate G1 may include a touch sensing region and a touch pin line region. The touch sensing region may include a plurality of touch electrodes. The touch pin line region may include a plurality of touch lines. The touch lines may correspond to and be connected to the touch electrodes according to a one-to-one relationship. The array substrate may include a display region, a connecting region, and a packaging region. The display region may include an OLED structure. The OLED touch display panel may include a touch control chip. The connecting region may include a plurality of conductive lines 2 connected to the touch control chip. The connecting region may also include a passivation layer 3 on the conductive lines 2. A via hole 4 may be formed on a corresponding conductive line 2 in the passivation layer 3. The portion of the passivation layer 3 in the via hole 4 may be removed. A via hole 4 may correspond to at least one conductive lines. For example, the via hole may correspond to the conductive lines according to a one-to-one relationship. In another example, the via hole may correspond to a plurality of conductive lines. In another example, the via hole structure may correspond to all conductive lines 2. The number of conductive lines 2 corresponding to the via hole 4 should not be limited by the embodiments of the present disclosure. Also, the number of touch lines 1 and the number conductive lines 2 may be designed according to the connection relationship between the touch lines 1 and the conductive lines 2. The touch pin line region of the packaging substrate G1 may correspond to the connecting region of the array substrate G2.

The touch lines 1 may correspond to and be connected to the conductive lines through the via holes 4 according to a one-to-one relationship. Thus, the touch electrode pattern may be arranged on the first surface of the packaging substrate G1. The connecting region for connecting the touch lines and the conductive lines, connected to the touch control chip, may be formed on the array substrate G2. The touch electrode pattern may refer to the pattern formed by the touch electrodes. The touch control chip and a display chip may both be arranged on the array substrate G2, so that the touch control chip and the display chip may be bonded simultaneously onto the array substrate G2, and the first surface of the array substrate G2 and the first surface of the packaging substrate G1 may be facing each other. Further, the touch control chip may transfer signals to the touch lines 1 through the conductive lines 2 in the connecting region of the array substrate G2. The signals may be further transferred to the touch electrodes on the packaging substrate G1 to implement touch functions. Compared to an existing touch display panel, which includes the entire touch module being disposed on the top surface of the packaging substrate, the touch display panel provided by the embodiments of the present disclosure utilizes a touch electrode pattern disposed on the first or bottom surface of the packaging substrate G1. Further, the touch control chip may be arranged on the array substrate. After the packaging process, the first surface of the packaging substrate G1 and the first surface of the array substrate G2 may be bonded together to be facing each other. That is, the array substrate G2 and the packaging substrate G1 may both be thinned on the surface facing away from components packaged in between, e.g., the OLED structure. The surface of the array substrate, facing away from the components packaged in between, may be referred as the second surface of the array substrate. The surface of the packaging substrate, facing away from the components packaged in between, may be referred as the second surface of the packaging substrate. The overall thickness of the display panel may be reduced. The display panel may be thinner and lighter.

The touch control chip may refer to a chip or an equivalent combination of software and/or hardware configured to control, drive, and/or operate the touch functions of the OLED touch display panel. The display chip may refer to a chip or an equivalent combination of software and/or hardware configured to control, drive, and/or operate the display functions of the OLED touch display panel. In some embodiments, the touch control chip and the display chip are separate chips. In some other embodiments, the touch control chip and the display chip may be integrated together. The specific forms of the touch control chip and the display chip should not be limited by the embodiments of the present disclosure.

As shown in FIGS. 1 and 2, in the disclosed OLED touch display panel, to implement signal transfer between the touch electrodes on the first surface of the packaging substrate G1 and the touch control chip on the array substrate G2, the connecting region 23 may be formed. By arranging conductive lines 2 in the connecting region 23 to be connected to the touch lines 1 in the touch pin line region of the packaging substrate G1, signals can be transferred between the touch control chip and touch electrodes. To form one-to-one connections between the conductive lines 2 and the touch lines 1, the passivation layer 3 may be formed on the conductive lines 2 in the connecting region 23. Via holes 4 may be formed in the passivation layer 3, where the via holes 4 correspond to the conductive lines 2. One-to-one connections between the conductive lines 2 and the touch lines 1 may be formed through the via holes 4. The one-to-one connections may ensure the touch lines 1 to be independent or insulated from each other. Short circuits between touch lines 1 may be reduced or avoided.

Specifically, in the disclosed OLED touch display panel, as shown in FIG. 1, a conductive material M may be contained in the via holes 4. The conductive material M may be used to form connections between the touch lines 1 and the conductive lines 2. The conductive material M may be a same material as the cathode layer (not shown) of the OLED structure. By filling the via holes 4 with the conductive material M, such as the same material as the cathode layer of the OLED structure, electrical connections between the conductive lines 2 and the touch lines 1 may be formed. In some embodiments, the conductive material M may fill the via holes 4 completely. In some embodiments, the conductive material M may form a certain shape that connects the touch lines 1 with the conductive lines 2. The shape of the conductive material M may be defined by the shape of the via holes 4 in the passivation layer 3. In some embodiments, the passivation layer 3 may be made of polystyrene (PS). In some embodiments, the passivation layer 3 may also be a pixel defining layer (PDL). In the disclosure, the cathode layer of the OLED structure may refer to one or more cathodes of the OLED structure, and the anode layer of the OLED structure may refer to one or more anodes of the OLED structure. The cathode layer and the anode layer may be used to provide electric current for the OLEDs in the OLED structures for emitting light in operation.

In practice, as shown in FIGS. 1 and 2, in the disclosed OLED touch display panel, to implement one-to-one connections between the conductive lines 2 and the touch lines 1, and to transfer signals between the touch control chip and the touch electrodes, via holes 4 may be formed to correspond to the conductive lines 2 on the array substrate G2. The via holes 4 may correspond to the conductive lines 2 according to an one-to-one relationship. Alternatively, one via hole 4 may correspond to a plurality of conductive lines 2. Alternatively, one via hole 4 may correspond to all conductive lines 2. The via holes 4 may be filled with the same conductive material, e.g., metal, used to form the cathode layer of the OLED structure. Thus, the conductive lines 2 and the touch lines 1 may form one-to-one electrical connections.

In the fabrication process of the OLED touch display panel, the process to form the cathode layer of the OLED structure and the process to fill the via holes 4 may be implemented through a same deposition process. The fabrication process of the OLED touch display panel may therefore be simplified. The fabrication cost of the OLED touch display panel may be reduced. It should be noted that, any other suitable processes or methods may be used for the formation of the cathode layer and the filling of the via holes 4. The specific type of processes for forming the cathode layer and for filling the via holes 4 should not be limited by the embodiments of the present disclosure.

In practice, as shown in FIGS. 1 and 2, in the disclosed OLED touch display panel, the cathode layer of the OLED structure may be made of Mg—Ag alloys and/or Mg—Al alloys. Specifically, in the disclosed OLED touch display panel, the OLED structure may be disposed in the display region 21 of the array substrate G2. Often, the OLED structure may include an anode layer, a cathode layer, and a light-emitting layer between the anode layer and the cathode layer. When the OLED touch display panel is displaying images, the OLED structure may provide back light for the OLED touch display panel. The cathode layer of the OLED structure may be made of Mg—Ag alloys, Mg—Al alloys, and/or any other suitable materials used for forming a cathode layer. In the disclosed OLED touch display panel, the material used to form the cathode layer may also be used to fill the via holes 4 in the connecting region 23, so that conductive lines 2 may be electrically connected to the touch lines 1. Signals can be transferred between the touch control chip and the touch electrodes.

As shown in FIGS. 1 and 2, in the disclosed OLED touch display panel, as shown in FIG. 1, a protection layer 5 may be disposed on the first layer of the packaging substrate G1. The protection layer 5 may cover the touch electrodes. The protection layer 5 may be patterned to form opening regions that expose the touch lines 1, and the touch lines 1 may be formed in opening regions in the protection layer 5. That is, the touch lines 1 may correspond to the opening regions in the protection layer 5. Specifically, in the disclosed OLED touch display panel, the touch electrode pattern may be disposed on the first surface of the packaging substrate G1, and the protection layer 5, e.g., made of metal, may be disposed on the packaging substrate G1 to provide protection for the touch electrode pattern. The touch electrode pattern may be the pattern formed by the touch electrodes. After the packaging process, the protection layer 5 may ensure the touch electrodes on the first surface of the packaging substrate G1 would not form short circuits with any metal films on the array substrate G2. The OLED touch display panel may maintain normal touch functions and display functions. Because the touch control chip is placed on the array substrate G2, the conductive lines 2 in the connecting region 23 may be connected to the touch lines 1 in the touch pin line region. The touch control chip may thus be connected to the touch electrodes through the touch lines 1. Signals may be transferred between the touch electrodes on the packaging substrate G1 and the touch control chip on the array substrate G2. Thus, the protection layer 5, used for protecting the touch electrode pattern, may include opening regions where the touch lines 1 are located. When packaging the OLED touch display panel, the touch pin line region may correspond to the connecting region 23. The conductive lines 2 and the touch lines 1 may form one-to-one electrical connections. During the packaging process, a pressing force may be applied on the packaging substrate G1 and the array substrate G2 to improve the contact between the packaging substrate G1 and the array substrate G2. Contact resistance between the packaging substrate G1 and the array substrate G2 may be reduced. At the same time, the resistance of the conductive lines 2 in the connecting region 23, which connects to the touch control chip, may meet the requirement of basic resistance standard. The touch performance of the OLED touch display panel may be improved.

Further, in the disclosed OLED touch display panel, the touch electrodes may be made of indium tin oxide (ITO). Specifically, the touch electrodes may be made of ITO or any other suitable materials capable of realizing touch functions. The touch electrode pattern may include a single-layered touch electrodes or a multiple-layered touch electrodes. That is, the specific touch structures may be adjusted according to different products and/or designs and should not be limited by the embodiments in the present disclosure. Accordingly, the touch lines 1 may be made of a commonly used metal, e.g., Cu and/or Al. The touch lines 1 may also be made of ITO. The touch lines 1 and the touch electrodes may be made of a same material or different materials. The fabrication of the touch lines 1 may be adjusted according to actual requirements of the fabrication process and should not be limited by the embodiments of the present disclosure.

As shown in FIGS. 1 and 2, in the disclosed OLED touch display panel, the conductive lines 2, which connect to the touch lines 1 on the packaging substrate G1, may be arranged in the connecting region 23 of the array substrate G2. A passivation layer 3 may be disposed on the conductive lines 2 to protect the conductive lines 2 so that the conductive lines 2 are electrically insulated from other metal films. Further, via holes 4 may be formed in the passivation layer 3 to correspond to the conductive lines 2, so that the touch lines 1 may form one-to-one connections with the conductive lines 2. Specifically, in the disclosed OLED touch display panel, the passivation layer 3 may be made of a suitable organic insulating material. The passivation layer 3 may protect the conductive lines 2 that are connected to the touch control chip. The via holes 4 may be formed at suitable locations in the passivation layer 3 where the connections between the conductive lines 2 and the touch lines 1 are desired so that the conductive lines 2 and the touch lines 1 may form connections through the via holes 4. When a suitable deposition process, e.g., a vapor deposition, is used to form the cathode layer of the OLED structure, the via holes 4 in the passivation layer 3 may be filled with metal used for forming the cathode layer. The via holes 4 may be independent of each other to ensure that the touch lines 1 and the conductive lines 2 form one-to-one connections. Short circuits, which impair the touch performance of the OLED touch display panel, may thus be prevented or reduced.

As shown in FIGS. 1 and 2, in the disclosed OLED touch display panel, the connecting region 23 may be located between the display region 21 and the packaging region 22. That is, the connecting region 23 maybe located in the area encircled by the packaging region 22 to ensure the material of the cathode layer to stay stable. Specifically, as shown in FIG. 2, the array substrate G2 may include the display region 21, the packaging region 22, and the connecting region 23 located between the display region 21 and the packaging region 22. Thus, the connecting region 23 may be protected. By packaging the OLED touch display panel, the connecting region 23 may be packaged between the packaging region 22 and the display region 21. The conductive lines 2, connected to the touch control chip on the array substrate G2, may be connected to the touch lines 1. The touch lines 1 are connected to the touch electrodes on the packaging substrate G1. Signals may be transferred between the touch control chip and the touch electrodes. By arranging the connecting region 23 on the array substrate G2, which corresponds to the touch pin line region on the packaging substrate G1, the touch lines 1 in the touch pin line region may be electrically connected to the conductive lines 2 in the connecting region 23 after the packaging process. The touch function of the OLED touch display panel may be implemented. Meanwhile, because the touch electrode pattern is arranged on the first surface of the packaging substrate G1 and the touch control chip is arranged on the array substrate G2, the array substrate G2 and the packaging substrate G1 may both be thinned on the surface facing away from the OLED structure encapsulated in between. The overall thickness of the OLED touch display panel may be reduced. The disclosed OLED touch display panel may be lighter and thinner.

Figure 4:
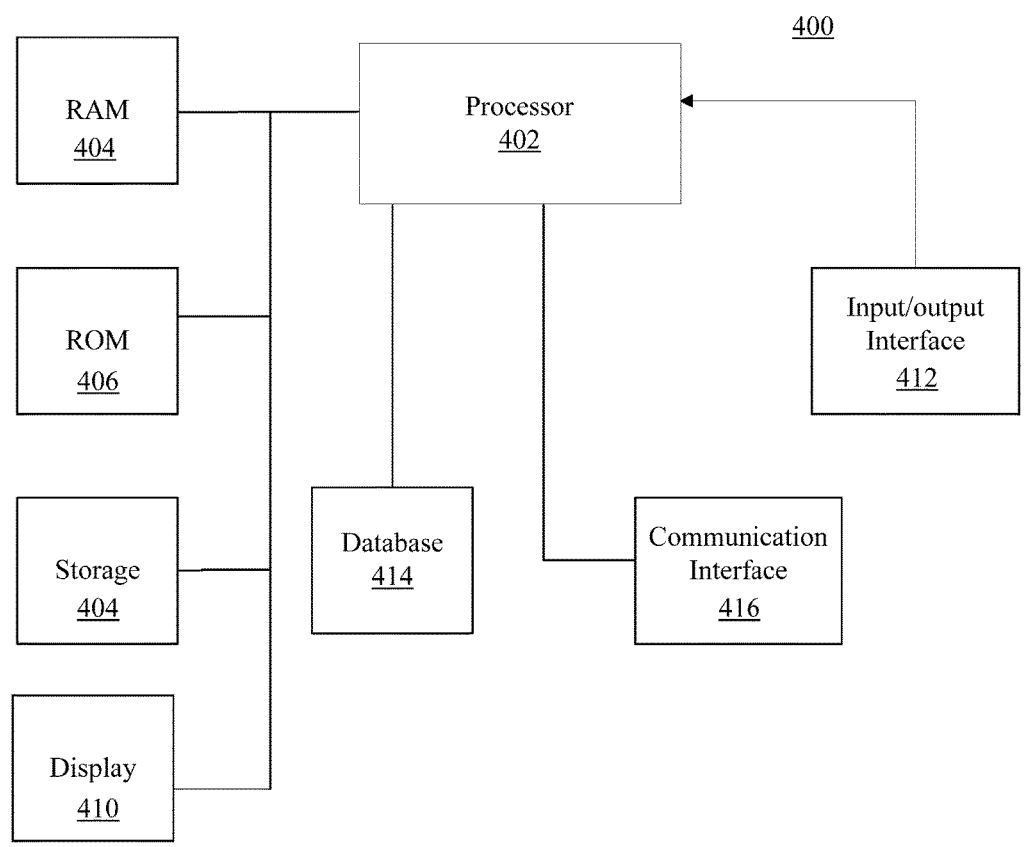
FIG. 4 illustrates an exemplary processing unit according to embodiments of the present disclosure.

The touch control chip and the display chip may be controlled by a processing unit. FIG. 4 illustrates a block diagram of the processing used in the embodiments of the present disclosure. The processing unit 400 is configured to control, drive, and/or operate any suitable touch functions of the OLED touch display panel. The processing unit 400 may receive, process, and execute commands from the OLED touch display panel. The processing unit 400 may include any appropriately configured computing system. As shown in FIG. 4, processing unit 400 may include a processor 402, a random access memory (RAM) 404, a read-only memory (ROM) 406, a storage 408, a display 410, an input/output interface 412, a database 414, and a communication interface 416. Other components may be added and certain devices may be removed without departing from the principles of the disclosed embodiments. The touch control chip and/or the display chip may be integrated in the processing unit 400 or may be separate parts. The specific forms of the touch control chip, the display chip, and the processing unit 400 would not affect the functions of the processing unit 400. The processing unit 400 may include suitable hardware and/or software, e.g., computer programs and circuitry, for performing desired functions.

Processor 402 may include any appropriate type of general purpose microprocessor, digital signal processor or microcontroller, and application specific integrated circuit (ASIC). Processor 402 may execute sequences of computer program instructions to perform various processes associated with processing unit 400. Computer program instructions may be loaded into RAM 404 for execution by processor 402 from read-only memory 406, or from storage 408. Storage 408 may include any appropriate type of mass storage provided to store any type of information that processor 402 may need to perform the processes. For example, storage 408 may include one or more hard disk devices, optical disk devices, flash disks, or other storage devices to provide storage space.

Display 410 may provide information to the processing unit 400. Display 410 may include any appropriate type of computer display device or electronic device display (e.g., CRT or LCD based devices). Input/output interface 412 may be provided for users to input information into processing unit 400 or for the users to receive information from processing unit 400. For example, input/output interface 412 may include any appropriate input device, such as a keyboard, a mouse, an electronic tablet, voice communication devices, touch screens, or any other optical or wireless input devices. Further, input/output interface 412 may receive from and/or send to other external devices.

Further, database 414 may include any type of commercial or customized database, and may also include analysis tools for analyzing the information in the databases. Database 414 may be used for storing information for semiconductor manufacturing and other related information. Communication interface 416 may provide communication connections such that processing unit 400 may be accessed remotely and/or communicate with other systems through computer networks or other communication networks via various communication protocols, such as transmission control protocol/internet protocol (TCP/IP), hyper text transfer protocol (HTTP), etc.

In one embodiment, a user may touch the screen of the OLED touch display panel. The touch electrodes may sense the touch motion and transfer signals reflecting the touch motion to the processor 402 through the touch lines 1. The processor 402 may receive, and process the received signals to configure relative information of the touch motion, e.g., the location of the touch motion. The communication interface can communicate with the processor 402 for further actions based on the configuration of the touch motion. Suitable data may be stored in ROM 406 and storage 408 to be processed. After the signal is processed, relative information based on the touch motion can be obtained. The information may be used by the processor 402 for further actions for the user via the display 410 or the input/output interface 412. In this embodiment, the input/output interface 412 and the display 410 may both be realized through the touch sensing display panel.

Figure 3:
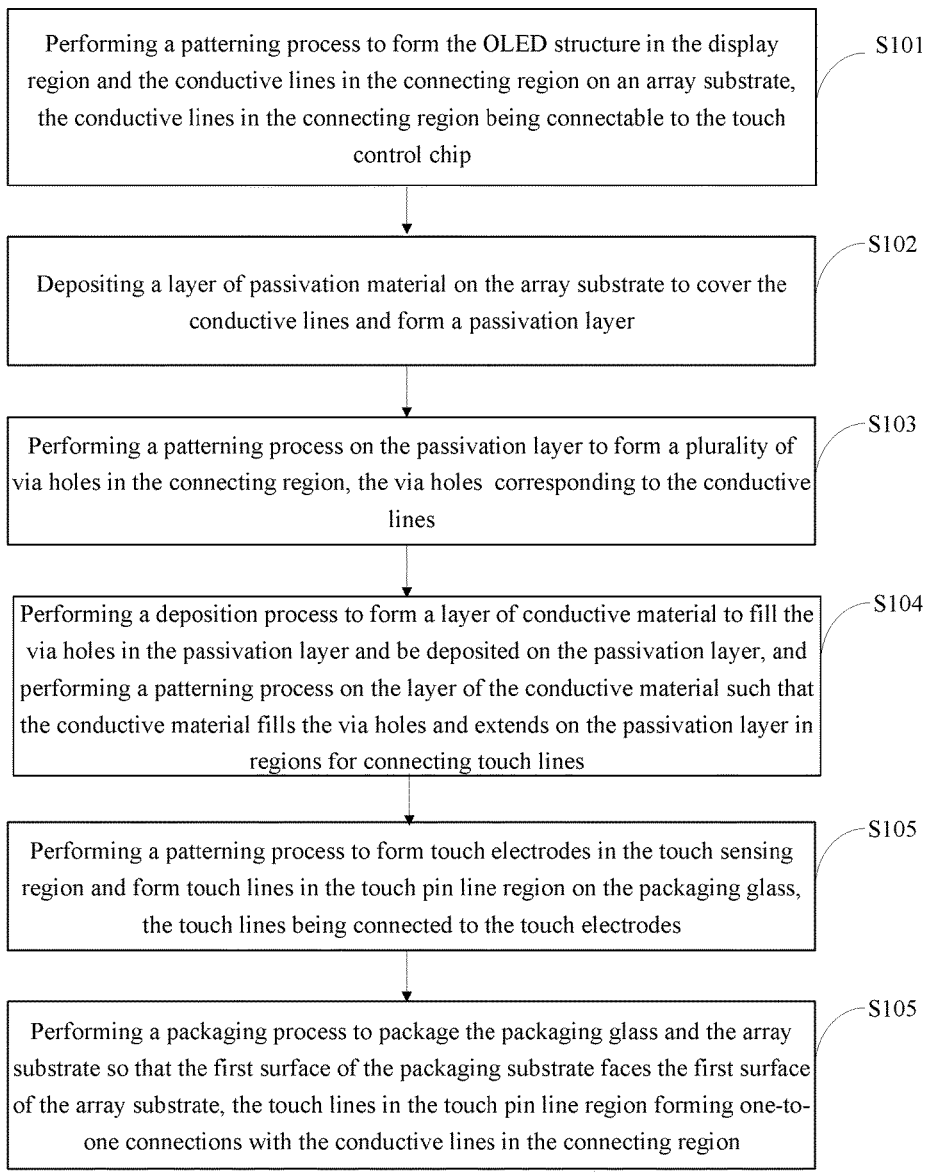
FIG. 3 is a flow chart of an exemplary process for fabricating the OLED touch display panel.

Another aspect of the present disclosure provides a method for fabricating the OLED touch display panel. As shown in FIG. 3, the method may include steps S101 to S106. To start the fabrication process, a packaging substrate and an array substrate may first be provided. The packaging substrate may include a touch sensing region and a touch pin line region. The array substrate may include a display region, a connecting region, and a packaging region.

In step S101, on the array substrate, a patterning process may be performed to form the OLED structure in the display region and the conductive lines in the connecting region. The conductive lines in the connecting region may be connectable to the touch control chip.

In step S102, a layer of passivation material may be deposited on the array substrate to cover the conductive lines and form a passivation layer.

In step S103, a patterning process may be performed on the passivation layer to form a plurality of via holes in the connecting region, the via holes corresponding to the conductive lines.

In step S104, a deposition process may be performed to form a layer of conductive material to fill the via holes in the passivation layer and be deposited on the passivation layer, and a patterning process may be performed on the layer of the conductive material so that the conductive material may fill the via holes and extend on the passivation layer in regions for connecting touch lines.

In step S105, a patterning process may be performed to form touch electrodes in the touch sensing region and form touch lines in the touch pin line region on the packaging substrate. The touch lines are connected to the touch electrodes.

In step S106, a packaging process may be performed to package the packaging substrate and the array substrate. The touch lines in the touch pin line region may form one-to-one electrical connections with the conductive lines in the connecting region.

Specifically, as shown in FIGS. 1 and 2, in the disclosed method for fabricating the OLED touch display panel, the touch electrode pattern may be disposed on the first surface of the packaging substrate G1. The connecting region 23 may be arranged on the array substrate G2 for connecting the conductive lines 2 and the touch lines 1. The touch lines 1 may be connected to a touch control chip on the array substrate G2. The arrangement or configuration may enable the touch control chip and the display chip to be both placed on the array substrate, so that the touch control chip and the display chip may be simultaneously bonded onto the array substrate and the first substrate of the array substrate G2 and the first surface of the packaging substrate G1 may be facing each other. After being bonded onto the array substrate G2, the touch control chip may transfer signals to the touch lines 1 through conductive lines 2 in the connecting region of the array substrate G2. The signals may be further transferred to the touch electrodes on the packaging substrate G1. Touch functions of the OLED touch display panel may be implemented.

Compared to an existing OLED touch display panel, which includes the entire touch module arranged on the first surface of the packaging substrate, in the disclosed OLED touch display panel, the touch electrode pattern may be arranged on the first surface of the packaging substrate G1. Further, the touch control chip may be arranged on the array substrate G2. After the packaging process, the array substrate G2 and the packaging substrate G1 may both be thinned on the surfaces facing away from the OLED structure encapsulated in between. The surface of the array substrate G2, facing away from the components packaged in between, may be referred as the second surface of the array substrate G2. The surface of the packaging substrate G1, facing away from the components packaged in between, may be referred as the second surface of the packaging substrate G1. The overall thickness of the OLED touch display panel may be reduced. The resulting OLED touch display panel may be lighter and thinner.

As shown in FIGS. 1 and 2, according to the disclosed method for fabricating the OLED touch display panel, in one embodiment of the present disclosure, step S101 may include using a patterning process to form the anode layer (not shown) of the OLED structure and the conductive lines 2 in the display region 21 of the array substrate G2. Specifically, in the fabrication process, the anode layer of the OLED structure and the conductive lines 2 for connecting the touch control chip may be formed through one patterning process in step S101. The fabrication process of the OLED touch display panel may be reduced. In step S101, after the patterns of the anode layer and the conductive lines 2 are formed, an anode protection layer (not shown) may be deposited. Further, a patterning process, including exposure and development, may be performed to form openings in the anode protection layer to expose the anode layer. The locations of the openings may correspond to the light-emitting region on the anode layer. Meanwhile, the same exposure and development may be used to form via holes 4 in the connecting region 23 to expose the conductive lines 2. The conductive lines 2 may be connected to the touch lines 1 on the packaging substrate G1. After forming openings in the anode protection layer, to align the array substrate G2 and the packaging substrate G1, and form tight or close bonding between the array substrate G2 and the packaging substrate G1, as shown in step S102, it may be desired to form a passivation layer 3 in the connecting region 23. The passivation layer 3 may provide support for the bonding between the array substrate G2 and the packaging substrate G1. The passivation layer 3 and the anode protection layer may be made of a same material or different materials. In some embodiments, the passivation layer 3 and the anode protection layer may be made of a same material, e.g., an organic insulating material. The specific choices of materials for forming the passivation layer 3 and the anode protection layer may be subjected to different applications and/or designs, and should not be limited by the embodiments of the present disclosure.

Further, as shown in FIGS. 1 and 2, the disclosed method for forming the OLED touch display panel may also include forming gates, semiconductor layers, drains, and sources in the display region 21 of the array substrate G2 from steps S101 to S104. Specifically, the disclosed method may further include fabrication of a plurality of necessary functional films or components, e.g., gates, semiconductor layers, sources, drains, pixel electrodes. The gates, semiconductor layers, sources, and drains may be formed for thin-film transistors (TFTs) in the display region 21. The TFTs may be configured to control and/or drive the pixels in the display region. The necessary functional films may ensure the OLED touch display panel to function properly, e.g., display images properly. The fabrication of the necessary functional films or components may be determined or adjusted according to different applications or designs, e.g., the specific type of the OLED structure. For example, the sources and the drains may be formed in the same fabrication step as conductive lines. It should be noted that, the fabrication of the above mentioned functional films or components are known to those skilled in the art and is not repeated herein.

According to the disclosed method for fabricating the OLED touch display panel, as shown in FIGS. 1 and 2, one patterning process may be used to form the gates in the display region 21 of the array substrate G2 and the conductive lines 2 in the connecting region 23. Alternatively, one patterning process may be used to form the sources and drains in the display region 21 of the array substrate G2 and the conductive lines 2 in the connecting region 23. Specifically, the conductive lines 2 in the connecting region 23 may be fabricated through a same patterning process that is used for forming the anode layer of the OLED structure in steps S101. The conductive lines 2 in the connecting region 23 may also be fabricated through a same patterning process used for forming the gates, or sources and drains of the OLED structure. The fabrication process to form the OLED touch display panel may be simplified. The fabrication cost may be reduced. It should be noted that, the fabrication of the conductive lines 2 may be subjected to different applications and/or designs and should not be limited by the embodiments of the present disclosure.

In step S104, as shown in FIGS. 1 and 2, according to the disclosed method, a same deposition process may be used to form the cathode layer of the OLED structure in the display region 21 of the array substrate G2 and to fill the via holes 4 corresponding to the conductive lines 2 in the connecting region 23. For example, in some embodiments, the mask used for the deposition of the cathode layer may be changed or adjusted so that the mask has the pattern corresponding to the conductive lines 2 in the connecting region 23. Meanwhile, the pattern of the mask in the display region 21 remains the same. Thus, in the fabrication process, the process for forming the cathode layer of the OLED structure and the process for filling the via holes 4 may be the same deposition process. The via holes 4 may be covered or masked during the fabrication process except the deposition of the cathode layer so that the via holes 4 may be properly filled with same material for forming the cathode layer. The via holes 4 may be independent and/or separated from each other. The fabrication process to form the OLED touch display panel may be simplified. The fabrication cost may be reduced. It should be noted that, in the fabrication process, other processes or method may also be used to form the cathode layer and to fill the via holes 4. The specific processes should not be limited by the embodiments of the present disclosure.

Furthermore, as shown in FIGS. 1 and 2, the disclosed method for forming the OLED touch display panel may further include depositing a protection layer 5 on the packaging substrate G1 in step S105, the protection layer 5 covering the touch electrodes and the touch lines 1. Step S105 may further include patterning the protection layer 5 to form opening regions corresponding to the locations of the touch lines 1 to expose the touch lines 1. Specifically, according to the disclosed method, the protection layer 5, e.g., made of metal, may be formed on the packaging substrate G1 to protect the touch electrode pattern. After the packaging process, the protection layer 5 may ensure no short circuit is formed between the touch electrodes on the first surface of the packaging layer G1 and the metal films on the array substrate G2. The protection layer 5 may ensure the OLED touch display panel to function properly, e.g., have normal touch functions and display functions. Because the touch control chip is disposed on the array substrate G2, touch lines 1, in the touch pin line region, are required to form electrical connections with the conductive lines 2 in the connecting region 23, so that signals can be transferred between the touch electrodes, on the packaging substrate G1, and the touch control chip, on the array substrate G2. Thus, the protection layer 5, for protecting the touch electrode pattern, may include opening regions corresponding to the locations of the touch lines 1. The opening regions may be independent and/or separated from each other so that the touch lines 1 may be insulated and separated from each other. When packaging the OLED touch display panel, the touch pin line region may correspond to the connecting region 23, and the conductive lines 2 and the touch lines 1 may form one-to-one electrical connections. Meanwhile, when packaging the OLED touch display panel, a pressing force may be applied on the packaging substrate G1 and the array substrate G2 so that the packaging substrate G1 and the array substrate G2 may form a tight contact. Contact resistance between the packaging substrate G1 and the array substrate G2 may be reduced. At the same time, a tight contact may ensure the conductive lines 2 in the connecting region 23 and connecting the touch control chip, to meet basic resistance standard. The touch performance of the OLED touch display panel may be improved.

Embodiments of the present disclosure provide an OLED touch display panel, a method for fabricating the OLED touch display panel, and a display apparatus containing the OLED touch display panel. The disclosed OLED touch display panel may include a packaging substrate and an array substrate. The first surface of the packaging substrate may include a touch sensing region and a touch pin line region. The touch sensing region may include touch electrodes. The touch pin line region may include a plurality of touch lines. The touch lines may correspond to and be connected to the touch electrodes through the via holes according to a one-to-one relationship. The array substrate may include a display region, a connecting region, and a packaging region. The display region may include an OLED structure. The packaging region may include a touch control chip. The connecting region may include a plurality of conductive lines connected to the touch control chip. The connecting region may also include a passivation layer on the conductive line. The via holes may be formed on the corresponding conductive lines in the passivation layer.

The touch pin line region of the packaging substrate may correspond to the connecting region of the array substrate. The touch lines may correspond to and be connected to the conductive lines according to an one-to-one relationship. Thus, the touch electrode pattern may be arranged on the first surface of the packaging substrate, and the connecting region for connecting the touch lines and the conductive lines, may be formed on the array substrate. The conductive lines may be connected or connectable to the touch control chip. The touch control chip and a display chip may both be arranged on the array substrate, so that the touch control chip and the display chip may be bonded simultaneously onto the array substrate. Further, the touch control chip may transfer signals to the touch lines through the conductive lines in the connecting region of the array substrate. The signals may be further transferred to the touch electrodes on the packaging substrate to implement touch functions. Compared to an existing touch display panel, which includes the entire touch module being disposed on the top surface of the packaging substrate, the touch display panel provided by the embodiments of the present disclosure utilizes touch electrode pattern disposed on the first or bottom surface of the packaging substrate. Further, the touch control chip may be arranged on the array substrate. After the packaging process, the array substrate and the packaging substrate may both be thinned on the surface facing away from components packaged in between. The overall thickness of the display panel may be reduced. The display panel may be thinner and lighter.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. An organic light-emitting diode (OLED) touch display panel, comprising:
    a packaging substrate, having a touch sensing region and a touch pin line region on a first surface of the packaging substrate, the touch sensing region including a plurality of touch electrodes, the touch pin line region including a plurality of touch lines forming one-to-one electrical connections with the touch electrodes; and
    an array substrate, having a display region, a connecting region, and a packaging region on a first surface of the array substrate, the display region having an OLED structure, the connecting region having a plurality of conductive lines connectable to a touch control chip, wherein:
    the first surface of the packaging substrate and the first surface of the array substrate are facing each other, the conductive lines forming one-to-one connection with the touch lines through a plurality of via holes.

2. The OLED touch display panel according to claim 1, wherein:
    on the array substrate, the connecting region is between the display region and the packaging region; and
    the touch pin line region of the packaging substrate corresponds to the connecting region of the array substrate.

3. The OLED touch display panel according to claim 1, wherein the connecting region further includes a passivation layer on the conductive lines, the passivation layer including the plurality of via holes, the conductive lines forming one-to-one electrical connections with the touch lines through the via holes.

4. The OLED touch display panel according to claim 3, wherein each of the via holes corresponds to one of the conductive lines.

5. The OLED touch display panel according to claim 3, wherein the via holes are filled with a conductive material for connecting the conductive lines and the touch lines.

6. The OLED touch display panel according to claim 5, wherein a cathode layer of the OLED structure is formed with a same conductive material.

7. The OLED touch display panel according to claim 6, wherein the via holes and the cathode layer of the OLED structure are formed through a same deposition process.

8. The OLED touch display panel according to claim 1, wherein the first surface of the packaging substrate further includes a protection layer for protecting the touch electrodes, the protection layer having a plurality of openings and each opening corresponding to one touch line.

9. A touch display apparatus, comprising one or more of the OLED touch display panels according to claim 1.

10. A method for forming an organic light-emitting diode (OLED) touch display panel, comprising:
    forming an OLED structure in a display region and conductive lines in a connecting region on a first surface of an array substrate, the conductive lines being connectable to a touch control chip;
    forming a passivation layer on the array substrate to cover the conductive lines;
    forming a plurality of via holes in the passivation layer to expose the conductive lines and filling the via holes in the passivation layer with a conductive material;
    forming a patterned layer of a conductive material to fill the plurality of via holes and extend on the passivation layer in regions for connecting touch lines;
    forming touch electrodes in a touch sensing region and forming touch lines in a touch pin line region on a first surface of a packaging substrate; and
    packaging the packaging substrate and the array substrate so that the first surface of the packaging substrate faces the first surface of the array substrate, wherein the conductive lines forming one-to-one connections with the touch lines through the plurality of via holes.

11. The method according to claim 10, further including performing one patterning process to form an anode layer of the OLED structure and the conductive lines.

12. The method according to claim 10, further including forming gates, semiconductor layers, drains, and sources of thin-film transistors (TFTs), and pixel electrodes in the display region.

13. The method according to claim 12, further including performing one patterning process to form gates and the conductive lines.

14. The method according to claim 12, further including performing one pattering process to form the sources, the drains, and the conductive lines.

15. The method according to claim 10, wherein forming the patterned layer of the conductive material includes depositing a layer of the conductive material to fill the via holes in the passivation layer and be deposited on the passivation layer, and patterning the layer of the conductive material so that the conductive material fills the via holes and extends on the passivation layer in regions for connecting touch lines.

16. The method according to claim 10, further including performing a deposition process to form a cathode layer of the OLED structure and fill the via holes in the passivation layer.

17. The method according to claim 16, further including:
    forming a protection layer on the first surface of the packaging substrate to cover the touch electrodes and the touch lines; and
    forming opening regions in the protection layer to expose the touch lines.

18. The method according to claim 10, further including:
    thinning a second surface of the packaging substrate that faces away from the OLED structure; and
    thinning a second surface of the array substrate that faces away from the OLED structure.

* * * * *